United States Patent
Wang et al.

[11] Patent Number: 6,036,773
[45] Date of Patent: Mar. 14, 2000

[54] METHOD FOR GROWING GROUP III ATOMIC LAYER

[75] Inventors: Xue-Lun Wang; Mutsuo Ogura, both of Tsukuba, Japan

[73] Assignee: Agency of Industrial Science & Technology, Ministry of International Trade & Industry, Tokyo, Japan

[21] Appl. No.: 08/826,422

[22] Filed: Mar. 27, 1997

[30] Foreign Application Priority Data

Aug. 21, 1996 [JP] Japan ................................. 8-219787

[51] Int. Cl.$^7$ .................................................. C30B 23/04
[52] U.S. Cl. .......................... 117/97; 117/101; 117/106; 117/913; 117/923; 117/953
[58] Field of Search ............................ 117/101, 97, 106, 117/953, 913, 923

[56] References Cited

U.S. PATENT DOCUMENTS 4,987,094  1/1991  Colas et al. ............................ 117/101
5,714,006  2/1998  Kizuki et al. .......................... 117/101

FOREIGN PATENT DOCUMENTS 59-25217  2/1984  Japan ..................................... 117/101

OTHER PUBLICATIONS

Maa et al., "Reflectance–differnece spectroscopy study of surface reactions in atomic layer epitaxy of GaAs using trimethylgallium and tertiarybutarsine", Applied Physics Letters vol. 58(20) pp. 2261–2263, May 20, 1991.

Usui et al,. "InGaP/GaAs single quantum well structure growth of GaAs facet walls by choride atomic layer epitaxy", Applied Physcis Letters vol. 56 (3) pp. 289–291, Jan. 15, 1990.

*Primary Examiner*—Robert Kunemund
*Attorney, Agent, or Firm*—Oblon, Spivak, McClelland, Maier & Neustadt, P.C.

[57] ABSTRACT

A Group III atomic layer required for fabrication of a semiconductor quantum nanostructure is grown to be properly restricted to a monolayer.

A substrate is configured to have a fast-growth surface portion where growth of a Ga atomic layer proceeds at a relatively high rate and a slow-growth surface portion where the growth of the Ga atomic layer proceeds at a relatively low rate. Ga atoms are supplied to the fast-growth surface portion in an amount not less than that which grows one layer of the Group III atoms. Excess Ga atoms on the fast-growth surface portion are allowed to migrate to the slow-growth surface portion by surface migration, thereby growing only one layer of the Ga atoms on the fast-growth surface portion.

3 Claims, 2 Drawing Sheets

- As ATOM
○ Ga ATOM

METHOD FOR GROWING GROUP III ATOMIC LAYER

BACKGROUND OF THE INVENTION

1. Field of the Invention

This invention relates to a method for growing a Group III atomic layer, more particularly to a method for growing a Group III atomic monolayer that is exactly one atom thick on a prescribed portion of a substrate, thereby opening the way to atomically controlled fabrication of the quantum wires, quantum boxes and other semiconductor quantum nanostructures which are viewed as basic structures for next-generation, high-performance optical devices and electronic devices.

2. Description of the Prior Art

The ever-increasing discreteness of energy levels and intensification of density of states resulting from increasingly smaller semiconductor microstructures point to the theoretical possibility of the appearance of various new quantum phenomena in small dimension semiconductor nanostructures. For example, it has been predicted that ultra-high speed field effect transistors will be realized by markedly suppressing the various electron scattering processes in quantum wires and that the oscillation threshold current temperature and its dependence of semiconductor lasers will be reduced by utilizing quantum wires and quantum boxes as the active layers. Researchers around the world are in fact actively exploring small-dimension semiconductor quantum nanostructures because they believe them to be indispensable to the building of the next generation of large-capacity, ultra-high speed information and communication systems.

To enable these and other quantum phenomena, the low-dimension quantum nanostructure should preferably satisfy the following conditions:

(1) Small Quantum Structure Size:

Pronounced quantum mechanical phenomena arise in small-sized semiconductor quantum nanostructures only when the energy difference between the first and second quantum energy levels of the structures is much larger than the electron thermal energy kT (k: Boltzmann constant, T: absolute temperature). In the case of AlGaAs/GaAs, for example, a structure with dimensions not exceeding 15 nm is required to satisfy this condition at room temperature.

(2) High Density

When quantum wires are used as conducting channels, for example, the amount of electric current passing through a single quantum wire is limited due to the single electron mode nature of quantum wires. Therefore, to obtain enough current to drive the following stage, circuit, it is necessary to increase the wire density and use multiple paths in parallel. Similarly, in the case of configuring a semiconductor laser using a quantum nanostructure as the active layer, it becomes necessary to increase the quantum nanostructure density in order to enhance the light confinement coefficient.

(3) High Uniformity

In all quantum nanostructure, quantum effects can be attributed to intensified density of states. However, maintaining the state intensification requires quantum nanostructures of consistent size. To ensure adequate quantum effects, the quantum nanostructure size fluctuation generally has to be held to under around 10%.

(4) High Quality

Securement of a high degree of electron migration and high light emission efficiency requires a high-quality quantum nanostructure without defects.

Various methods for satisfying these conditions have been proposed regarding the fabrication of quantum wires, quantum boxes and sundry other semiconductor quantum nanostructures. These include, for example, the method of directly processing two-dimensional structures using electron beam lithography and etching techniques, the method of selective growth on a non-planar substrate by metal-organic chemical vapor deposition (MOCVD) and molecular beam epitaxy (MBE) etc., as well as self-organization growth methods and the like. Among these, MOCVD selective growth is viewed as a particularly promising technology for its ability to fabricate defect-free quantum nanostructures by enabling their formation in the course of crystal growth.

Since this method requires a growth temperature of higher than around 700° C. to achieve high selectivity, however, it is still inadequate on a number of points regarding the size, uniformity and crystal purity of the quantum nanostructures obtained.

Previously, before the accomplishment of this invention, the inventors proposed a method for fabrication of AlGaAs/GaAs quantum wires by use of flow rate modulation epitaxy (FME) FEM is basically a method in which Group III materials and Group V materials are supplied alternately. Taking Ga and As as examples of Group III and V atoms, each growth cycle consists of four gas supply periods as shown in FIG. 2: a Ga supply period t1, an $H_2$ purge period t2, an As supply period t3 and an $H_2$ purge period t4. (Ga can be supplied using triethylgallium (TEGa) and As using $AsH_3$, for example.) This cycle is repeated a prescribed number of times. As indicated by bias flow Ro, a small amount of As (an amount not causing crystal growth) is supplied continuously even during the Ga supply period t1 and the $H_2$ purge periods t2 and t4. Owing to the extremely low arsenic partial pressure during the Ga supply period, the surface migration of Ga atoms is promoted, particularly at tow temperatures. The supply of the small amount of $AsH_3$ also suppresses desorption of As atoms from the substrate surface during the periods t1, t2 and t4 and prevents invasion of impurities. Crystal of extremely high quality can therefore be grown.

However, FME fundamentally lacks a self-limiting mechanism when it is applied to a flat substrate with uniform physical properties. Therefore, if atoms in an amount greater than that which causes growth of a single atomic layer (an atomic monolayer) are supplied (i.e., when the thickness of the film to be grown during each growth cycle is set greater than an atomic monolayer), the excess atoms form droplets on the surface. This degrades the crystal quality. Conventionally, therefore, it has been important to hold the growth rate to less than one atomic monolayer, generally to less than 0.7–0.9 atomic layer. In light of this conventional practice, the quantum wire fabrication proposed earlier by the inventors limits the growth rate to not more than 0.9 atomic layer per growth cycle. When this method was used to grow AlGaAs/GaAs quantum wires in V-grooves formed in a substrate, fairly good results were obtained as regards reducing the lateral width and improving the crystal quality of the fabricated quantum wires.

Thus, thanks to the application of FME, quantum nanostructures can be viewed as having reached a practically utilizable level in terms of size and crystal quality. Nevertheless, their density and uniformity still fall far short of practical requirements and stand as a major obstacle to the realization of high performance devices. Moreover, since there is a tradeoff between density and uniformity in quantum nanostructures, improvement in both aspects has been extremely difficult with conventional technologies. For example, while sufficiently high density can be achieved by use of advanced technologies such as electron beam lithograph, structures that are uniform on the atomic level are extremely difficult to achieve by etching in accordance with the exposed pattern. Since the conventional etching and lithograph are not atomically controlled processes. The size fluctuation is therefore considerable. Generally, when the substrate pattern size falls below around 1 µm and becomes smaller than the material migration length on the substrate surface, the effect of the substrate size fluctuation on the crystal growth process becomes pronounced, in the end causing large fluctuation in the size of the quantum nanostructures.

A need is thus felt for a crystal growth method capable of fabricating practicable quantum nanostructures—a method that is substantially unaffected by substrate pattern fluctuation and capable of atomic layer level control. This invention was accomplished to meet this need, which is not satisfied by any technology proposed heretofore. The object of this invention is therefore to provide a new method suitable for forming quantum nanostructures including at least a Group III atomic layer which is little affected by substrate pattern density, tolerates size fluctuation to a high degree, and enables Group III atomic layers to be formed properly only as monolayers.

SUMMARY OF THE INVENTION

To achieve this object, the inventors extensively studied how materials supplied by FME migrate on the surface of the substrate. As a result, they ascertained that when fast and slow crystal growth surface portions lie adjacent to each other, growth of Group III atomic monolayers on the fast-growth surface portions forms stable Group III surfaces on these portions. Thereafter, no crystal growth occurs on the stable surfaces even if supply of the Group III atoms is continued. In other words, the growth stops (is self-limited), and the excess atoms migrate to the slow-growth surface portions. This means that if fast and slow crystal growth surface portions are provided adjacently on the substrate beforehand and the fast-growth surface portions are defined as prescribed surface portions for fabrication of quantum nanostructures, then, differently from common belief, Group III atomic monolayers can be grown alone on the prescribed portions even if Group III atoms are supplied in an amount per growth cycle exceeding that which grows atomic monolayers.

When this method is implemented, it suffices to set the upper limit of the amount of atoms supplied to less than the amount which forms atomic monolayers on the slow-growth surface portions following the formation of the atomic monolayers on the fast-growth surface portions. When the slow-growth surface portions consist of contiguous surface portions having different growth rates, it in principle suffices to set tho upper limit of the amount of atoms supplied to less than the amount which forms an atomic monolayer on the surface portion having the slowest growth rate.

Further, the slow-growth surface portions can be constituted as planar surface portions of the substrate and the fast-growth surface portions as the bottoms of V-grooves formed in the substrate or, in particular, if the Group III atom is Ga, surface portions which from the viewpoint of the Ga atoms are appropriately divided into slow-growth surface portions and fast-growth surface portions can be formed by making the planar surface portions of the substrate (001) surfaces and the inclined side surfaces of the V-grooves (111)A surfaces. In the case of V-grooves, however, the inclined side (111)A surfaces of the V-grooves are substantially the surfaces having the lowest growth rate. Therefore, if the amount of Group III atoms supplied is less than the amount which forms Group III atomic monolayers on the inclined surfaces, Group III atomic monolayers will be formed only on the V-groove bottoms. Nevertheless, the most reliable method is, as just explained, to define flat surface portions as the slow-growth surface portions and supply Group III atoms in an amount less than that which forms atomic monolayers thereon.

Owing to the positive utilization of surface migration in FME in this invention, the Group III atomic layer experiences self-limited growth, thereby enabling the growth to be limited to a proper atomic monolayer only and making it possible to obtain high quality semiconductor quantum nanostructures that are uniform on the atomic layer order. In particular, since the invention tolerates fluctuations present in the substrate pattern to a high degree, it is able to ensure that, in the end, all of the quantum structures are formed to uniform atomic layer precision. This invention is the first to achieve this effect and, as such, can be expected to contribute greatly to the advancement of this type of semiconductor quantum nanostructure, lead to the discovery of various new quantum phenomena, and find applications in a broad range of optoelectronic devices.

DESCRIPTION OF THE PREFERRED EMBODIMENT

Figure 1A:
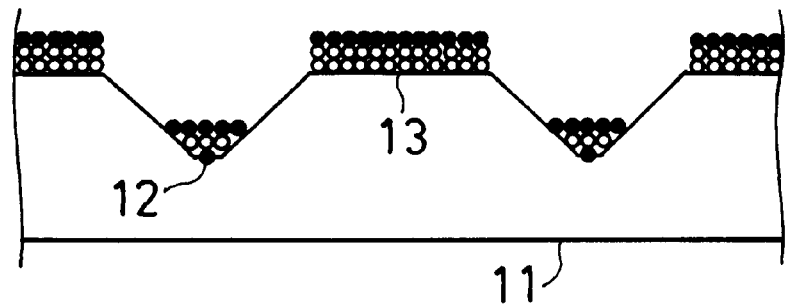
FIG. 1(A) is a schematic view for explaining the first step of a method that is an embodiment of this invention.

A preferred embodiment of the invention will now be explained with reference to FIGS. 1 and 2. FIG. 1(A) shows a GaAs substrate whose flat surface 13 has been formed at a prescribed pitch (lateral spacing) with V-grooves extending in the [0, −1, 1] direction. As a result, the inclined surfaces of the V-grooves are (111)A surfaces. The flat surface 13 of the GaAs substrate constitutes slow-growth surface portions 13 where the growth of the Ga atoms assumed as the Group III atoms grow relatively slowly, while the V-groove bottom portions 12 constitute fast-growth surface portions 12 where growth is relatively fast. FIG. 1(A) shows an intermediate state in which a Ga atomic monolayer has already been formed on an atomic monolayer of As as a Group V atom and an As atomic monolayer has been further formed on the Ga atomic monolayer. This invention can, however, be applied from the time of forming the first Ga atomic layer.

Basically in accordance with FME as described in the foregoing, after stopping the supply AsH$_3$, TEGa is supplied to the substrate surface terminated with As atoms, also in the manner described earlier, whereby Ga atoms first migrate from the inclined surfaces of the V-grooves to the portions 12 of the V-grooves constituting the fast-growth surface portions 12. The thickness of the grown GaAs film is dependent on the amount of TEGa supplied. If the amount of TEGa which forms exactly a single Ga atomic layer on the bottom of each V-groove 12 is supplied, then, since the $AsH_3$ partial pressure is generally very low during TEGa supply (corresponding to period t1 in FIG. 3) and during $H_2$ purge (corresponding to period t2 in FIG. 3), the V-grooves bottoms will change substantially to Gaterminated surfaces. On the other hand, since the growth rate is slower at the slow-growth surface portions 13 than in the V-grooves, the slow-growth surface portions 13 are not completely Ga-terminated and, as shown in FIG. 1(B), dangling As sites (not bonded with Ga atoms) remain.

Figure 1B:
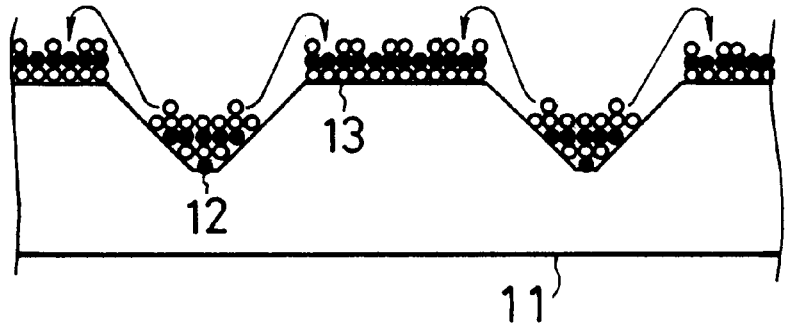
FIG. 1(B) is a schematic view for explaining the second step of the method.

When still more TEGa is supplied in this state (i.e., when the amount of TEGa is supplied is greater that which forms Ga atomic monolayers on the fast-growth surface portions 12), then, since the migration length of the Ga atoms on the Ga-terminated surface is longer than the migration length of the Ga atoms on the As-terminated surfaces and the mixed As-Ga surfaces (surfaces where the Ga covering rate is less than 100%), the excess atoms in the V-groove bottoms 12 do not remain on the V-grooves bottoms 12 but, as indicated by the arrows in FIG. 1(B), migrate as far as the (001) slow-growth surface portions 13 where they bond with the still available As atoms. Since the Ga atom migration length is quite long under typical growth conditions, the (111)A surface can easily be made shorter than this migration length, as will be further elucidated in an example to follow. Specifically, a condition enabling utilization of this surface migration can be easily established by setting the V-groove pitch to under around 2 $\mu$m, for example.

Figure 1C:
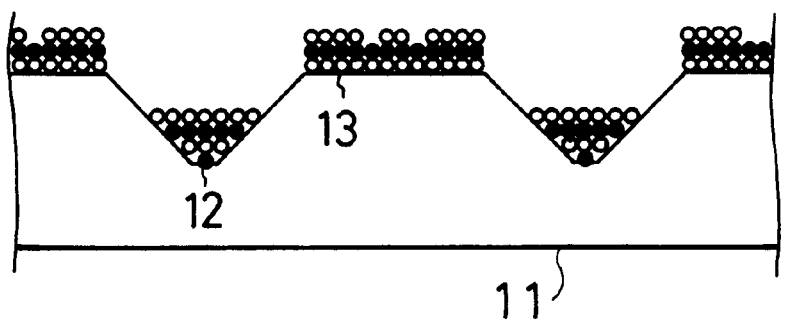
FIG. 1(C) is a schematic view for explaining the third step of the method.

Differently from what has been generally accepted, therefore, even when Group III atoms are supplied in excess of the amount that forms atomic monolayers on the prescribed surface portions (the V-groove bottoms), a single layer of the Group III atoms can, as shown in FIG. 1(C), be properly formed alone on each prescribed surface portion independently of the amount of TEGa supplied. In other words, self-limited growth is achieved. In the case of a substrate cross-sectional structure such as shown in FIG. 1, however, it is conceivable that after the flat surface 13 constituting the slow-growth surface portions 13 has fully occupied by Ga atoms, the excess Ga atoms may fall back into the fast-growth surface portions 12 via the V-groove inclined surfaces constituting the surface portions where growth is slowest. When this is liable to occur, therefore, the maximum amount of Ga atom supply is preferably set to an amount smaller that which forms atomic monolayers on the inclined surfaces constituting the surface portions where, owing to the principle of the growth mechanism, growth is slowest and is more preferably set to an amount smaller than that which forms an atomic monolayer on the flat surface 13 constituting the slow-growth surface portions 13.

Figure 1D:
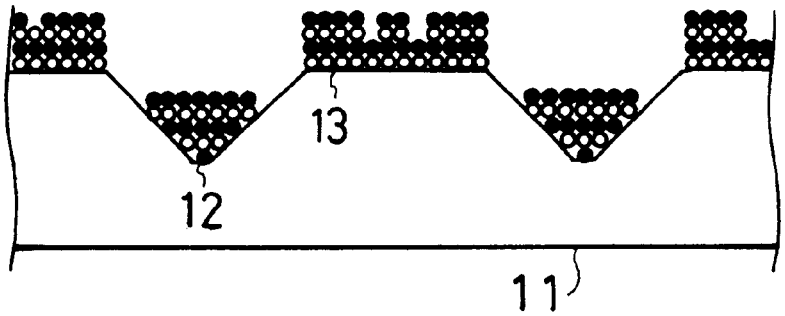
FIG. 1(D) is a schematic view for explaining the fourth step of the method.
Figure 3:
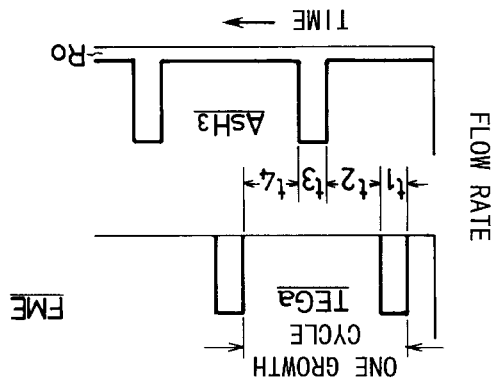
FIG. 3 is a time-sequence diagram for explaining the characteristics of flow rate modulation epitaxy (FME) in terms of raw material supply.
Figure 2:
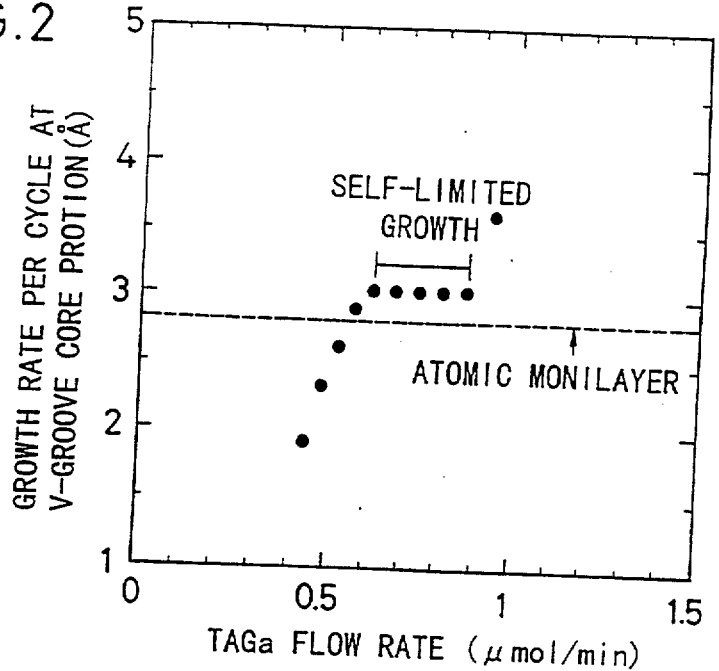
Figure 3:
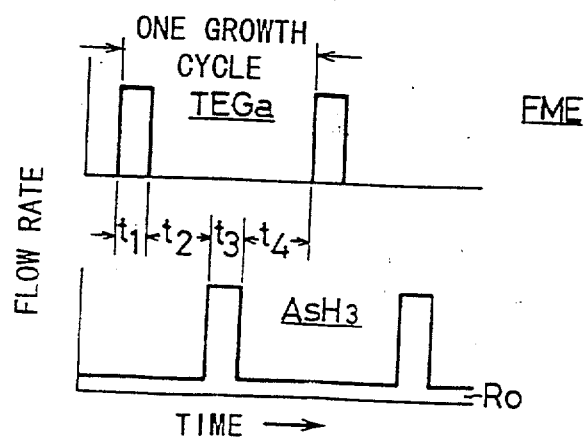

After Ga atomic monolayers have been formed on the V-groove bottoms 12 constituting the prescribed surfaces on which quantum nanostructures are to be fabricated in accordance with the invention, if $AsH_3$ is then supplied during period t3 in accordance with the sequence indicated in FIG. 3, an As atom bonds with each Ga atom, whereby as shown in FIG. 1(D), As atomic monolayers can be formed on at least the prescribed surface portions. In the case of a Group V atom as typified by As, the vapor pressure is generally liable to become high during crystal growth. As a result, a relationship readily arises in which bonding proceeds solely with the Group III atoms one by one. The film growth on the prescribed surface portions can therefore be easily limited to single atomic layers. By then repeating the procedure including the step of forming Ga atomic layers in accordance with this invention from the state shown in FIG. 1(A), GaAs quantum nanostructures consisting of the required number of stacked layers can be formed on the prescribed surface portions 12. Thus by positively utilizing the surface migration mechanism, this invention can achieve self-limited growth of Group III atomic layers in a controlled mode, even when employing FME. This invention is therefore clearly distinct from ordinary prior-art adsorption saturation atomic layer epitaxy and can be called "surface migration" atomic layer epitaxy. In ordinary adsorption saturation epitaxy, since the metal-organic material is supplied to the substrate surface without disassociation of the molecules, a large amount of the carbon contained in the metal-organic molecules is assimilated by the crystal, making it difficult to obtain crystal of high purity. Since this does not occur in the surface migration atomic layer epitaxy according to this invention, the purity of the crystal is of a high level substantially indistinguishable from that obtained by MOCVD under optimum growth conditions.

A specific example of the invention will now be explained. A GaAs substrate with (001) surface orientation was wet-etched by a solution of $NH_4OH:H_2O_2:H_2O=1:3:50$ after ordinary photolithography to form [0, -1, 1] oriented V-grooves at a pitch of 2 $\mu$m one side surface of the substrate. TEGa and TMAl (trimethylaluminum) were used as the Group III raw material and $AsH_3$ diluted to a concentration of 20% with $H_2$ was used as the Group V raw material. In each cycle, $AsH_3$ was supplied at the amount of approximately 2.98 $\mu$mol/min over a supply period t3 of 1 sec, $AsH_3$ was passed at 0.9 $\mu$mol/min as the bias flow Ro indicated in FIG. 3, and the growth temperature was set at about 640° C. At this temperature, the AlGaAs barrier growth profile does not depend on the grown film thickness. Since the AlGaAs growth profile is therefore stable, the effect of change therein on the GaAs growth rate can be precluded.

A laminated structure of AlGaAs/GaAs quantum wires was grown under these conditions while varying the amount of TEGa supplied. The growth rate of the GaAs wire layers was determined by observing the sample in cross-section with a transmission electron microscope. The relationship between the GaAs growth rate at the core portion of the V-grooves during each cycle and the TEGa flow rate was shown in the graph of FIG. 2. As is clear from this graph, the GaAs growth stopped over a considerably wide range of TEGa flow rate. The occurrence of self-limited growth was thus verified.

Figure 2:
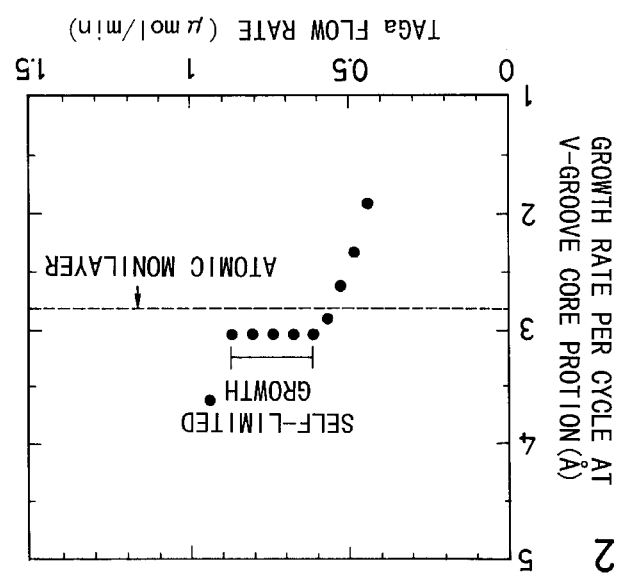
FIG. 2 is a graph showing how growth rate per cycle varied as a function of raw material supply amount in an example according to the invention.

The small difference between the growth rate in the selflimited growth region of FIG. 2 (3.05 Å, about 1.08 atom layer/cycle) and the expected growth rate of 1 atom layer/cycle is thought to have arisen because the shape of the fabricated V-grooved substrate differed slightly from the assumed ideal shape.

The increase in TEGa flow rate over the range in which no excess growth occurred was advantageously about 40% relative to that at the time the growth began to stop. This means that when the amount of Ga atoms supplied within this range is set on the high side, substrate pattern size fluctuations can be greatly absorbed and tolerated to a corresponding degree. Within the range of self-limited growth, formation of more than one atomic layer does not occur on large size nanostructure portions even when the amount of Ga atoms supplied is on the high side. Growth can therefore be limited to a single atomic layer at both the large and small size nanostructure portions. In ordinary MOCVD or when, as has been the practice up to now, FEM is adopted in which the raw material supply is held to less 0.9 atomic layer or less per growth cycle, no such effect of absorbing and tolerating substrate pattern size fluctuations to such an extremely high degree can be expected.

In terms of principle, this invention can also be applied to Al atoms, which are members of the Group III. Since Lhe migration length of Al atoms is markedly shorter than that of Ga atoms, however, the example explained in the foregoing does not contemplate the application of the invention to Al atom layers in the AlGaAs structure. When the invention is to be so applied, it becomes necessary, for example, to implement measures for forming the V-grooves at a pitch on the submicron order.

The relationship between the fast-growth surface portions 12 and the slow-growth surface portions 13 is not limited to that of V-grooves and flat surfaces as illustrated. The requirement is only that the substrate be configured to have regions with differing Group III atom growth rates. This can be achieved by other valley-hill configurations or by configurations that appear flat but have regions whose physical properties produce different growth rates with respect to Group III atom growth. It is however necessary to adopt a configuration that enables atoms on the fast-growth surface portions to migrate to the slow-growth surface regions. It is therefore a requirement that the dimensions of the fast-growth surface portions be determined in light of the migration length of the Group III atoms concerned so that the maximum migration distance of the Group III atoms on the fast-growth surface portions is shorter than the Group III migration length. Further, to enable the Group III atoms to migrate over the distance to the farthest Group V site on the slow-growth surface portions, it is necessary for this distance to be shorter than the migration length of the Group III atoms used. These dimensional relationships are, however, natural deductions from a broader technical concept of the invention, namely, the concept of utilizing the surface migration effect to cause migration of Group III atoms from the fast-growth surface portions to the slow-growth surface portions.

As is clear from the mechanism of the invention explained in the foregoing, the slow-growth surface portions 13 can consist of contiguous portions with different growth rates. In such case, it in principle suffices to set the maximum amount of the Group III atoms supplied to not more than the amount that forms an atomic monolayer on the surface portion with the slowest growth rate among the plurality of surface portions. Therefore, while as explained in the foregoing the inclined surfaces of V-grooves can be defined as the surface portions with the slowest growth rate, it is, as in the foregoing embodiment, preferable and safest to set the amount to not more than that which forms an atomic monolayer on the flat surface 13. The Group III atom to which the invention is applied can be arbitrarily selected. Moreover, when the invention is applied to Ga atoms as in the foregoing embodiment, the supply of the Ga atoms is not limited to that in the form of TEGa as shown in the figures but can be conducted in any of various other modes instead. While a GaAs substrate was used in the foregoing embodiment, an InP substrate or any of various other substrates can be used instead. The nanostructures fabricated by the invention are not limited to the quantum wires discussed in the foregoing but can be quantum boxes or any of various other semiconductor quantum nanostructures requiring atomic layer control.

What is claimed is:

1. A method for growing Group III atomic layer which can be used for selectively growing a monolayer of Group III atoms on a surface of a substrate, the method comprising:

configuring the substrate surface to have a fast-growth surface portion where growth of the Group III atomic layer proceeds at a relatively high rate and a slow-growth surface portion where the growth of the Group III atomic layer proceeds at a relatively low rate, supplying Group III atoms to the fast-growth surface portion in an amount not less than that which grows one layer of the Group III atoms, and not more than an amount that grows one atomic layer on the slow-growth surface portion where the atomic layer grows later than on the high-growth surface region, and allowing excess Group III atoms on the fast-growth surface portion to migrate to the slow-growth surface portion by surface migration, thereby self-limiting the growth on the fast-growth surface portion and growing only one layer of the Group III atoms on the fast-growth surface portion.

2. A method according to claim 1, wherein the slow-growth surface portion is a flat surface portion of the substrate and the fast-growth surface portion is a bottom portion of a V-groove formed in the substrate.

3. A method according to claim 2, wherein the Group III atom is gallium, the flat surface portion of the substrate is a (001) surface and the V-groove has inclined side surfaces that are (111)A surfaces.

* * * * *

UNITED STATES PATENT AND TRADEMARK OFFICE
CERTIFICATE OF CORRECTION

PATENT : 6,036,773
DATED : March 14, 2000
INVENTOR(S) : Xue-Lun Wang and Mutsuo Ogura It is certified that error appears in the above-identified patent and that said Letters Patent is hereby corrected as shown below:

In the Drawings:

Sheet 2 of 2 should appear as shown on the attached page.

Signed and Sealed this

Fourteenth Day of November, 2000

Attest:

Q. TODD DICKINSON

*Attesting Officer*  *Director of Patents and Trademarks*